United States Patent [19]

Shoji

[11] Patent Number: 4,666,479
[45] Date of Patent: May 19, 1987

[54] SEMICONDUCTOR WAFER CONTAINER

[75] Inventor: Kikuchi Shoji, Tokyo, Japan

[73] Assignee: Tensho Electric Industrial Co., Ltd., Tokyo, Japan

[21] Appl. No.: 753,577

[22] Filed: Jul. 10, 1985

[51] Int. Cl.⁴ .............................................. B01D 53/02
[52] U.S. Cl. .................................... 55/385 R; 55/527; 55/528; 55/DIG. 13; 220/371
[58] Field of Search ............ 55/385 R, 385 C, 385 D, 55/385 F, 527, 528, DIG. 13, DIG. 42, 385 E, 487; 220/371, 372

[56] References Cited

U.S. PATENT DOCUMENTS

| | | | |
|---|---|---|---|
| 2,735,964 | 2/1956 | Grieve et al. | 55/365 E X |
| 3,069,831 | 12/1962 | Young et al. | 55/527 X |
| 3,494,113 | 2/1970 | Kinney | 55/528 X |
| 3,950,155 | 4/1976 | Komiyama | 55/316 X |
| 4,093,437 | 6/1978 | Ichihara et al. | 55/528 X |
| 4,322,385 | 3/1982 | Moetz | 55/487 X |
| 4,350,507 | 9/1982 | Greenough et al. | 55/DIG. 42 X |
| 4,487,606 | 12/1984 | Leviton et al. | 55/385 C X |
| 4,594,082 | 6/1986 | Catherwood | 55/316 |

OTHER PUBLICATIONS

European Patent Application No. 0,069,323, published Jan. 1, 1983.
T. Shriver & Company, Inc., "Filter Media" Bulletin No. 159, 1964.

Primary Examiner—Charles Hart
Attorney, Agent, or Firm—Wenderoth, Lind & Ponack

[57] ABSTRACT

This invention relates to a semiconductor wafer container having an air filter for removing fine particles from air, which serves to allow air to pass through a body of the container. This causes atmospheric pressure within and without the container body to be substantially identical to each other whereby dirty air is never introduced into the container body.

18 Claims, 8 Drawing Figures

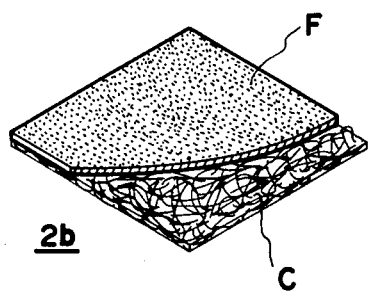
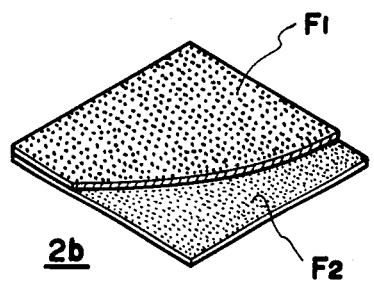
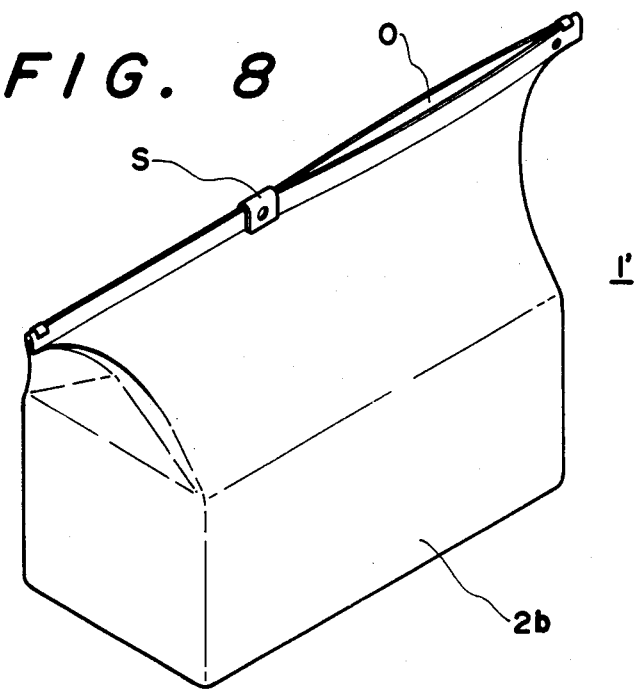

SEMICONDUCTOR WAFER CONTAINER

BACKGROUND OF THE INVENTION

A prior semiconductor wafer container which contains semiconductor wafers of high additional value is so light that the wafers can be transported by air. More particularly, such a semiconductor wafer container is essentially required to have a pressure-proof air-tight construction which withstands large variation in atmospheric pressure so as to be prevented from inhaling fine dust which tends to damage circuits on the semiconductor wafers, by breath even when it is subject to variation in atmospheric pressure on the ground or high in the atmosphere. Accordingly, the prior semiconductor wafer container has larger thickness or is formed of a material which locally reinforces it so as to have the desired physical strength to withstand variations in atmospheric pressure. Thus, it will be noted that the prior semiconductor wafer container is required to have more material than one which is used only on the ground. This results in an increase in weight and in high cost of material and manufacture, which prevents transportation by air from being made at low cost.

SUMMARY OF THE INVENTION

Accordingly, it is a principal object of the invention to provide a semiconductor wafer container adapted to make atmospheric pressure within and without a container body substantially identical, whereby dirty air is never introduced into the container body when it is transported by air.

It is another object of the invention to provide a semiconductor wafer container adapted to have no pressure-proof air-tight construction, which allows it to be manufactured at low cost.

In accordance with the present invention, there is provided a semiconductor wafer container comprising at least one wafer holding frame of synthetic resin material having a configuration providing a holding force giving rigidity to the frame relative to outer stress; a housing to contain the wafer holding frame and an air filter provided on the body of container for removing fine particles from the air.

BRIEF DESCRIPTION OF THE DRAWINGS

The above and other objects and features of the invention will be apparent from the description of the embodiments taken along with reference to the accompanying drawings in which;

FIGS. 4 through 7 are enlarged perspective views of different filter materials used for an air filter with portions of the filter materials of FIGS. 6 and 7 cut away;

and FIG. 8 is a schematic perspective view of a semiconductor wafer container constructed in accordance with another embodiment of the invention.

DETAILED DESCRIPTION OF THE PREFERRED EMBODIMENTS

Figure 1:
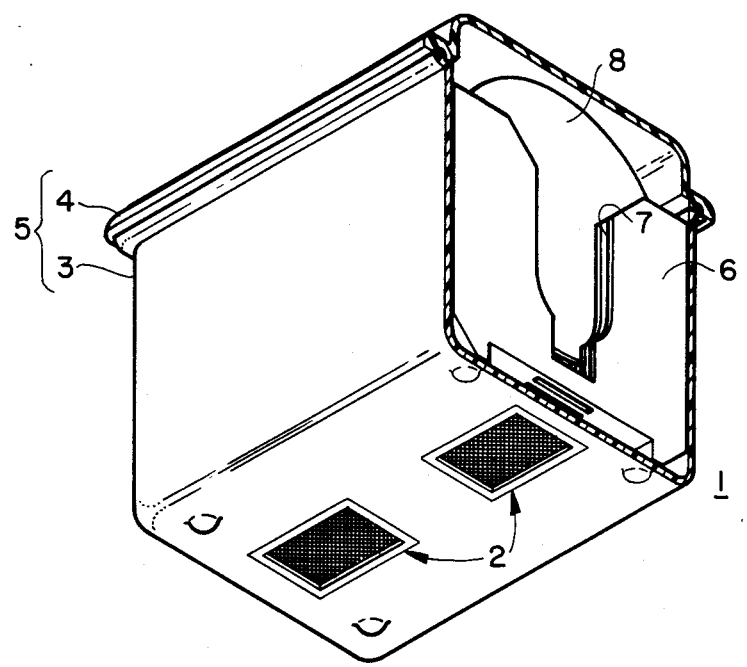
FIG. 1 is a schematic perspective view partly in cross section of a semiconductor wafer container constructed in accordance with one embodiment of the invention.

Some embodiments of the invention will be described with reference to the accompanying drawings. FIG. 1 illustrates a semiconductor wafer container 1 constructed in accordance with one embodiment of the invention. The semiconductor wafer container 1 comprises a housing 5 including a housing body 3 and a cover 4 covering an access opening in the housing body 3. The housing 5 also comprises at least one wafer holding frame 6 within in housing body 3, of synthetic resin material such as Teflon (trademark) or polypropylene having a configuration holding force so as to have rigidity relative to outer stress, that is, having sufficient rigidity so as to retain the shape of the housing against externally applied forces. The wafer holding frame has a plurality of slits 7, for example, which serves to hold semiconductor wafers 8, as is well known. The slits may be considered to define a cavity within the housing body 3. The wafer holding frame is contained in the housing body 3. The semiconductor wafer container 1 further comprises an air filter 2 of single or composite filter materials such as porous film produced by foaming urethane resin, for example, or non-woven fabric produced by fibers of fine thickness through which the cavity of the housing body 3 is in gaseous fluid communication with the outside atmosphere. The housing body 3 and the cover 4 are engaged with each other in an air-tight manner.

It should be noted that the wafer holding frame, the air filter 2 and the housing 5 may have a surface treated in an electrically conductive manner or formed of electrically conductive material in case the semiconductor wafer has circuits formed by a C-MOS technique to have less resistance relative to static electricity. The wafer holder frame may be integrally formed with the housing 5. The air filter 2 may be treated in a water-proof manner so that filtering function is never lost even when it is exposed to water.

Figure 2:
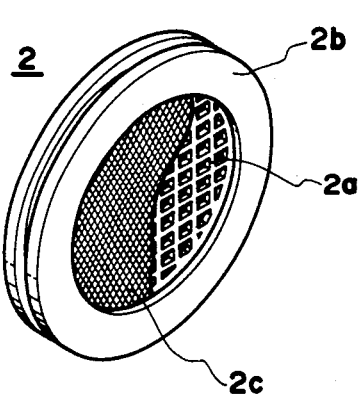
FIG. 2 is an enlarged perspective view of an air filter used in the semiconductor wafer container of FIG. 1 with a portion cut away.
Figure 3:
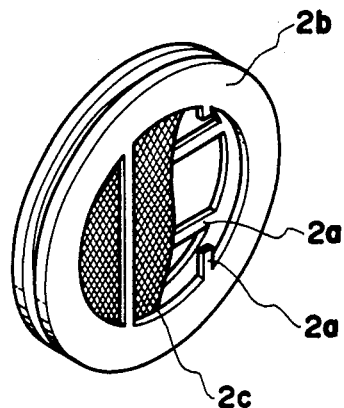
FIG. 3 is an enlarged perspective view of a modified air filter.

As shown in FIG. 2, the air filter 2 may comprise a reinforced frame 2b having grid 2a provided thereon with a filter film or sheet 2c mounted on the grid 2a. This causes the filter film or sheet 2c to extend when any outer force is applied thereto so as to enlarge mesh of the filter 2, which prevents the filtering function from being lost or prevent the filter film or sheet 2c from being removed from the reinforced frame 2a. As shown in FIG. 3, the grid 2a of the reinforced frame 2b may have openings larger than filter mesh. Furthermore, two grids 2a may be disposed on both sides of the filter film or sheet 2c, which causes the security of the filter film or sheet 2c to be further improved. The filter film or sheet 2c may be secured to the reinforced frame 2b. The air filter 2 may be more easily secured to the housing 5 by a supersonic wave welding tecknique in a more air-tight manner.

Figure 4:
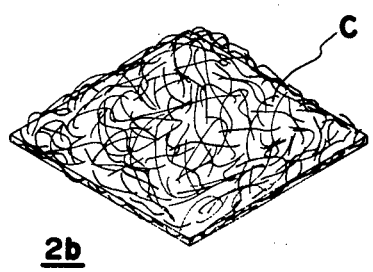
Figure 5:
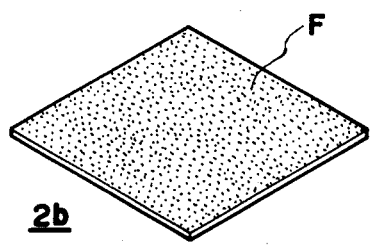

FIGS. 4 through 7 illustrate some examples of the filter film or sheet 2b. FIG. 4 shows an example C of the filter sheet 2b which is produced by compressing fibers of fine thickness into a non-woven sheet. FIG. 5 shows an example F of the porous filter film 2b which is produced by foaming urethane material into a film, for example. The porous filter film 2b has many holes of fine diameter such as less than 0.2 $\mu$m, for example, which enhances the filtering function of the air filter 2. Another example of the filter film or sheet 2b, shown in FIG. 6, comprises a composite of the non-woven filter sheet C of FIG. 4 and the filter film F of FIG. 5. The filter material 2b of FIG. 6 enhances the filtering function more effectively than those of the filter materials of FIGS. 4 and 5. Furthermore, the filter material 2b of FIG. 6 has a reduced degree of extension, which prevents filter mesh from being extended when excessive stress is applied to the air filter 2 so as to have no reduction in the filtration of the air. The filter film 2b of FIG. 7 comprises a plurality of filter films as shown in FIG. 5. In the illustrated embodiment, two filter films F1 and F2 are superposed above each other in a slightly spaced manner. If the diameters of meshes of the filter films F1 and F2 are different from each other in a stepped manner, then the stepped filtering function will be accomplished. This maintains a proper filtering function over a longer period of time.

Although not shown, the filter materials 2b may have solid filtering material such as active carbon included therein to absorb fine particles so as to accomplish an excellent filtering function. The composite filter material 2b may have fabric of general construction provided in place of non-woven fabric of FIG. 5.

FIG. 8 illustrates a semiconductor wafer container 1' constructed in accordance with another embodiment of the invention. The semiconductor wafer container 1' comprises a bag including a frame having a configuration holding force and filter material 2b mounted on the frame to cover said frame so as to constitute a part of the bag. The wafer holding frame not shown is disposed within the bag. An opening O for inserting or removing wafers or the wafer holding frame may be closed by a fastener S which seals the opening O in an air-tight manner. The semiconductor wafer container 1' may be repeatedly used or, alternatively it may be used only one time.

What is claimed is:

1. A container for holding semiconductor wafers, comprising:
    a housing having walls enclosing an internal cavity for containing the semiconductor wafers, said housing including a wafer holding frame formed of synthetic resin material, for holding the semiconductor wafers, said frame being disposed inside said walls and being of sufficient rigidity to retain the shape of said housing under external stress; and
    means for equalizing the air pressure within said cavity with respect to the air pressure outside said container, said equalizing means including an air filter provided in said walls, said internal cavity being inside said housing and in gaseous fluid communication with the exterior of said container only through said air filter.

2. A container as set forth in claim 1, wherein said air filter comprises a porous film of foamed synthetic resin.

3. A container as set forth in claim 1, wherein said air filter comprises a plurality of porous films of foamed synthetic resin superposed above one another in a slightly spaced manner and said porous films having openings of different diameter in a stepped manner.

4. A container as set forth in claim 1, wherein said air filter comprises non-woven fabric formed of compressed fibers of fine diameter.

5. A container as set forth in claim 1, wherein said air filter comprises a composite of porous film of foamed synthetic resin and non-woven fabric formed of compressed fibers of fine diameter.

6. A container as set forth in claim 1, wherein said air filter comprises a composite of porous film of foamed synthetic resin, non-woven fabric formed of compressed fibers of fine diameter and porous solid material mounted on said porous film and said non-woven fabric.

7. A container as set forth in claim 1, wherein said air filter comprises a composite of porous film of foamed synthetic resin and fabric which is superposed thereon.

8. A container as set forth in claim 1, wherein said air filter comprises a composite of porous film of foamed synthetic resin, fabric which is superposed thereon and porous solid material mounted on said porous film and said fabric.

9. A container as set forth in claim 1, wherein said air filter comprises a reinforced frame having a grid, and filter material mounted on said grid.

10. A container as set forth in claim 1, wherein said air filter comprises a reinforced frame having two grids, and filter material mounted between said two grids.

11. A container as set forth in claim 1, wherein said air filter includes filter material treated so as to have static electricity proofness.

12. A container as set forth in claim 1, wherein said air filter includes filter material treated in a water-proof manner.

13. A container as in claim 1, wherein said housing includes a housing body having said wafer holding frame therein and having an opening for inserting and removing the semiconductor wafers into and from said slits, and a cover removable mounted on said housing body so as to air tightly cover said opening.

14. A container as in claim 1, wherein said frame is formed integrally with said housing body.

15. A container as in claim 1, wherein said housing further comprises a wafer holding frame formed of said synthetic resin material, for holding the semiconductor wafers, said frame being disposed inside said walls and being of sufficient rigidity to retain the shape of said housing.

16. A container as in claim 1, wherein said housing further comprising a bag forming said walls, said bag enclosing said frame, said air filter forming a part of said bag.

17. A container as in claim 1, wherein said frame has a plurality of slits for holding the semiconductor wafers therein.

18. A container as in claim 17, wherein said frame is formed integrally with said housing body.

* * * * *